US009595635B2

(12) United States Patent
Hirotani et al.

(10) Patent No.: US 9,595,635 B2
(45) Date of Patent: Mar. 14, 2017

(54) POINT SOURCE LIGHT-EMITTING DIODE

(71) Applicant: Daido Steel Co., Ltd., Nagoya (JP)

(72) Inventors: Masumi Hirotani, Nagoya (JP); Shinji Iio, Nagoya (JP); Hidetoshi Sone, Nagoya (JP); Keizo Kawaguchi, Nagoya (JP); Cheng Chung Yang, Tainan (TW)

(73) Assignee: DAIDO STEEL CO., LTD., Nagoya, Aichi (JP)

( * ) Notice: Subject to any disclaimer, the term of this patent is extended or adjusted under 35 U.S.C. 154(b) by 0 days.

(21) Appl. No.: 14/639,037

(22) Filed: Mar. 4, 2015

(65) Prior Publication Data

US 2015/0255674 A1    Sep. 10, 2015

(30) Foreign Application Priority Data

Mar. 6, 2014   (JP) ................. 2014-044284

(51) Int. Cl.
| | | |
|---|---|---|
| H01L 33/00 | (2010.01) | |
| H01L 33/10 | (2010.01) | |
| H01L 33/38 | (2010.01) | |
| H01L 33/58 | (2010.01) | |
| H01L 33/14 | (2010.01) | |
| H01L 33/40 | (2010.01) | |

(52) U.S. Cl.
CPC ............ *H01L 33/10* (2013.01); *H01L 33/145* (2013.01); *H01L 33/38* (2013.01); *H01L 33/387* (2013.01); *H01L 33/405* (2013.01); *H01L 33/58* (2013.01)

(58) Field of Classification Search
CPC ............................... H01L 33/60; H01L 33/64

USPC .............................................. 257/98, 99, 100
See application file for complete search history.

(56) References Cited

U.S. PATENT DOCUMENTS

| | | | | |
|---|---|---|---|---|
| 5,543,638 A | * | 8/1996 | Nettelbladt | ........... H01L 33/105 257/103 |
| 5,753,941 A | * | 5/1998 | Shin | .................... H01S 5/18377 257/98 |
| 6,278,139 B1 | | 8/2001 | Ishikawa et al. | |
| 2010/0027576 A1 | | 2/2010 | Takeuchi | |
| 2010/0027578 A1 | | 2/2010 | Takeuchi | |

(Continued)

FOREIGN PATENT DOCUMENTS

| | | |
|---|---|---|
| JP | H 08-274408 A | 10/1996 |
| JP | H 11-233815 A | 8/1999 |

(Continued)

*Primary Examiner* — Tan N Tran
(74) *Attorney, Agent, or Firm* — McGinn IP Law Group, PLLC.

(57) ABSTRACT

The present invention relates to a point source light-emitting diode containing a support substrate, a metal layer, a first conduction-type layer, an active layer, a second conduction-type layer containing a current-narrowing structure, and a topside electrode having an aperture, stacking in this order, in which the metal layer is provided locally in an area corresponding to the aperture and has a metal reflection face by which a light generated in the active layer is reflected towards the aperture side, and the point source light-emitting diode further contains a light-reflection reduction face having a lower reflectivity and/or a higher absorptivity than the metal reflection face, provided around the metal reflection face.

20 Claims, 6 Drawing Sheets

(56) References Cited

U.S. PATENT DOCUMENTS

2012/0305964 A1* 12/2012 Akaike ............... H01L 33/0079
                                                      257/98

FOREIGN PATENT DOCUMENTS

| JP | 2006-148059 A | 6/2006 |
| JP | 2010-040602 A | 2/2010 |
| JP | 2010-040605 A | 2/2010 |
| JP | 2012-248795 A | 12/2012 |

* cited by examiner

POINT SOURCE LIGHT-EMITTING DIODE

FIELD OF THE INVENTION

The present invention relates to a point source light-emitting diode having a chip structure that suppresses side light leakage from end faces of the chips.

BACKGROUND ART OF THE INVENTION

There have been known chip-shaped light-emitting diodes having an active layer between a topside electrode and a support substrate, a current-narrowing structure designed so as to centralize driving current in a certain region of the active layer and to induce local emission of light from the certain region of the active layer, and a metal reflection layer for making the light emitted from the active layer toward the substrate side be reflected toward the side of the topside electrode, in which output light is given off via an aperture locally formed in the topside electrode. An example of them is the light-emitting diode disclosed in Patent Document 1. In such a light-emitting diode, among the light rays produced in the active layer, light ray directed to the side of the support substrate is reflected off the metal reflection layer toward the side of the topside electrode. Such a diode therefore has a characteristic of ensuring high light-output efficiency, compared with a highly angle-dependent multi-layer film reflection mirror (i.e., DBR layer, which stands for a distributed Bragg reflection layer), and has been utilized as a light sensor, an optical encoder or a point source of light in plastic optical fiber (POF) communications.

Patent Document 1: JP-A-2006-148059

SUMMARY OF THE INVENTION

The chip-shaped point source light-emitting diode as mentioned above has the metal reflection layer provided all over the cross section orthogonal to the thickness direction of the chip. Therefore, among the light rays radiating from a region of the active layer, a light ray reflected by the metal reflection layer is emitted from the end faces of the chip as it is or after undergoing multiple reflections between the metal reflection layer and the topside electrode. There have been cases where the side light rays leaking out from the end faces of the chip had an intensity of, for example, about 20% of the maximum intensity, and besides, they caused a trouble of mixing with output light given off via the aperture formed in the topside electrode of the point source light-emitting diode as a noise component. In some cases, this noise component is an impediment to performing measurements or communications utilizing the point source light-emitting diodes as light sources. For the purpose of improving resolution at the light emission point of a light-emitting diode, Patent Document 1 has carried out covering each of side walls formed around the light-emitting diode areas interspersed in island shapes with a wiring-cum-clad layer. However, there have been cases where formation of side walls in uniform thickness was difficult to end in failure to suppress side light reliably.

Against the background of the circumstances mentioned above, the present invention has been made. An object thereof is to provide a point source light-emitting diode which allows suppression of side light leakage from end faces of the point source light-emitting diode.

The present inventors conducted a variety of examinations and studies against the background of the foregoing circumstances, and as a result, they have found that the side light leakage from end faces of a point source light-emitting diode can be suppressed appropriately by providing a metal layer having a metal reflection face immediately underneath a local light emission region in the active layer of a point source light-emitting diode, and further providing a light-reflection reduction face around the metal reflection face. On the basis of such findings, the present invention has been made.

More specifically, the gist of the present invention consists in that (a) the present point source light-emitting diode contains a support substrate, a metal layer, a first conduction-type layer, an active layer, a second conduction-type layer containing a current-narrowing structure, and a topside electrode having an aperture, stacking in this order; (b) the metal layer is provided locally in an area corresponding to the aperture and has a metal reflection face by which a light generated in the active layer is reflected towards the aperture side; and (c) the present point source light-emitting diode further contains a light-reflection reduction face having a lower reflectivity and/or a higher absorptivity than the metal reflection face, provided around the metal reflection face.

According to the thus configured point source light-emitting diode, the metal reflection face is provided locally on an area of the metal layer facing to the aperture formed locally in the topside electrode, and reflects light generated in the active layer and makes the light direct toward the aperture's side, and around the metal reflection face is provided the light-reflection reduction face having a lower reflectivity and/or a higher absorptivity than the metal reflection face. Hence a portion of light rays directing toward the support substrate from a region of the active layer is reflected by the metal reflection face and another portion thereof is absorbed by the light-reflection reduction face without being reflected, and thereby side light leaking out from the end faces of a chip-shaped point source light-emitting diode can be suppressed adequately.

Herein, it is appropriate that the first conduction-type layer contains a first contact layer and the present point source light-emitting diode further contains a dielectric layer being in contact with a portion of the first contact layer and provided on the metal layer. According to such a layer structure, in the metal layer surface, there is an area covered with the dielectric layer which is in contact with a portion of the first contact layer. In the area, reaction between the metal layer and the first contact layer, that is, diffusion or alloying is inhibited, and therefore diffused reflection and light absorption are suppressed. As a result, a metal reflection face having a high reflectivity is formed on the active layer side of the metal layer. In this point, the dielectric layer acts as an alloying prevention layer.

In addition, it is appropriate that the dielectric layer be provided locally on an area of the first contact layer, corresponding to the aperture. According to such a structure, the area of the metal layer surface facing to the aperture is prevented from the reaction between the metal layer and the first contact layer, that is, diffusion or alloying, and therefore diffused reflection and light absorption are suppressed. Thus, a metal reflection face having a high reflectivity is formed on the active layer side of the metal layer.

Further, it is appropriate that, the present point source light-emitting diode further contain, in the interior of the dielectric layer, at least one intermediate electrode provided so as to pass through the dielectric layer for electric continuity between the first contact layer and the metal layer. According to such a structure, electric current to travel between the topside electrode and such at least one intermediate electrode comes to flow into the intermediate electrode passing through the dielectric layer provided in the area corresponding to the aperture formed locally in the topside electrode. Therefore, the current is centralized in the region of the active layer corresponding to the area directly underneath the aperture formed in the topside electrode, without diffusion. As a result, the active layer is made to emit light locally in the region corresponding to the area directly underneath the aperture formed in the topside electrode. Thus, side light emission is further suppressed.

Further, it is also appropriate that the metal layer be made to stack locally on the first contact layer in the same pattern as the dielectric layer in a state of adjoining the dielectric layer, or to stack overall on the first contact layer. When the metal layer is made to stack locally to the first contact layer, at least the dielectric layer and the metal layer are required to be patterned. On the other hand, when the metal layer is made to stack overall to the first contact layer, only the dielectric layer is subjected to patterning. In the case of making the metal layer stack overall to the first contact layer via the localized dielectric layer, alloying occurs at the boundary surface between the contact layer and the metal layer due to the temperature at the thermocompression bonding, resulting in formation of the light-reflection reduction face having a reduced reflectivity and/or an increased absorptivity. It is also possible to provide positively a layer containing a material for reduction of light reflection around the localized dielectric layer.

In addition, it is appropriate that the support substrate be bonded to the first contact layer by thermocompression via a metal adhesion layer containing a metal having a low melting point, and the present point source light-emitting diode further contain a diffusion-control barrier layer made to intervene between the metal adhesion layer and the metal layer. According to such a structure, it becomes possible to prevent reaction from occurring between the metal adhesion layer and the metal layer at the temperature when the metal adhesion layer melts. For the metal adhesion layer, metals having a low melting point, such as Au—In, Pb—Sn, In—Sn and Au—Sn are suitably used.

The intermediate electrode has no particular restrictions as to materials to be used therein, but the materials are preferably materials capable of forming ohmic electrodes. Examples of the material forming an ohmic electrode include AuZn, AuBe and ITO. In addition, the metal layer also has no particular restrictions as to materials to be used therein. Examples of the material usable therein include Ag, Al, Au, Pt and alloys containing any of these metals (e.g. AuZn). Additionally, there is nothing wrong with using either the same material or different materials in forming the intermediate electrode and the metal layer so long as such uses depart from the purport of the invention.

Further, it is appropriate that, in a cross section passing through the center of the aperture formed locally in the topside electrode, the metal reflection face have a diameter $L2$ and the aperture have a diameter $L1$, satisfying the relation of $0.2L1 \leq L2 \leq 1.8L1$, preferably the relation of $0.6L1 \leq L2 \leq 1.4L1$. According to such a structure, retention of output light intensity and suppression of side light are made compatible with each other, and the intensity of side light can be reduced without lowering the intensity of output light.

Furthermore, it is appropriate that the light-reflection reduction face have a reflectivity $RR2$ and the metal reflection face provided on the metal layer has a reflectivity $RR1$, satisfying the relation of $RR2 \leq 0.8RR1$. According to such a structure, retention of output light intensity and suppression of side light are made compatible with each other, and the intensity of side light can be reduced without lowering the intensity of output light. In addition, it is preferred that the reflectivity $RR1$ of the metal reflection face satisfy the relation of $RR1 \geq 70\%$ with respect to the light of wavelengths to be emitted from the active layer.

Further, it is preferred that, in the cross section passing through the center of the aperture, the metal reflection face have a distance D between an edge of the metal reflection face and a point of intersection of the normal to an edge of the aperture and the metal reflection face, satisfying the relation of $0 \leq D \leq 0.4L1$, preferably the relation of $0 \leq D \leq 0.2L1$, with respect to the aperture's diameter $L1$. According to such a structure, retention of output light intensity and suppression of side light are made compatible with each other, and the intensity of side light can be reduced without lowering the intensity of output light.

In addition, it is preferred that, the aperture have an area $A1$ and the metal reflection face have an area $A2$, satisfying the relation of $0.04A1 \leq A2 \leq 3.24A1$, preferably the relation of $0.36A1 \leq A2 \leq 1.96A1$. According to such a structure, retention of output light intensity and suppression of side light are made compatible with each other, and the intensity of side light can be reduced without lowering the intensity of output light.

Moreover, it is appropriate that the topside electrode have a distance $L3$ between one outer edge and another outer edge in the cross section passing through the center of the aperture formed locally in the topside electrode, satisfying the relation of $L2 \leq 0.9L3$. According to such a structure, suppression of side light can be achieved more effectively.

illustrates a multilayer structure of the product after the current-narrowing structure formation process P8 and the electrode formation process P9.

Figure 2:
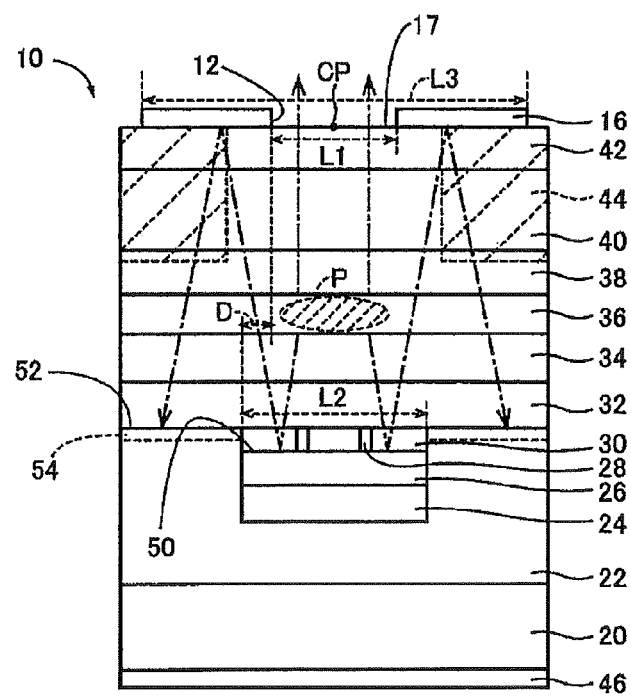
FIG. 2 is a vertical cross-section diagram for explaining schematically a multilayer structure of the point source light-emitting diode illustrated in FIG. 1, and this diagram is a cross section viewed from the direction along the arrow of the II-II line in FIG. 1.
Figure 8:
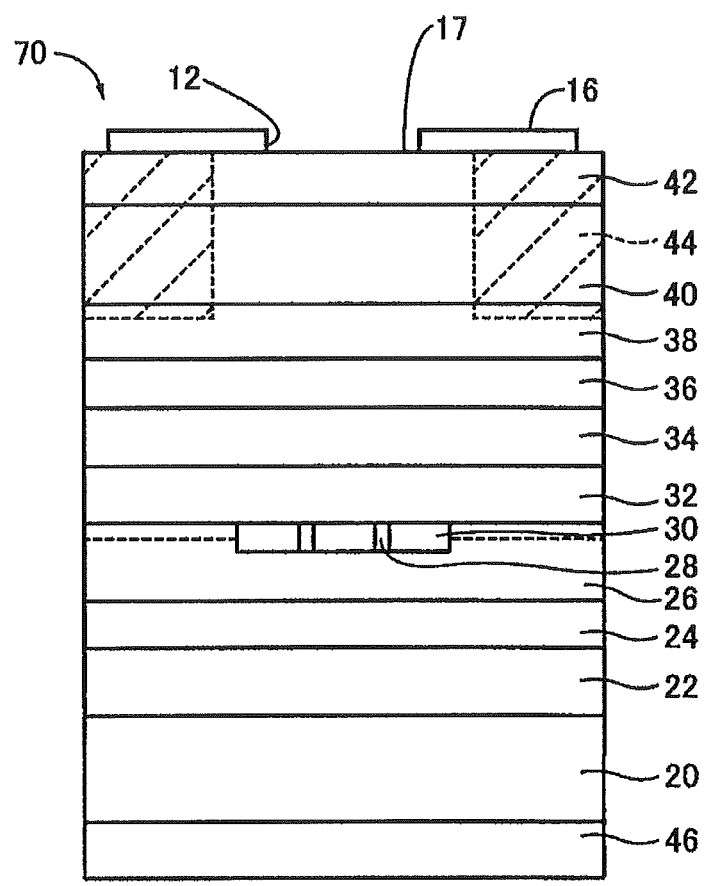

FIG. 8 is a vertical cross-sectional diagram for illustrating schematically the multilayer structure of a point source light-emitting diode according to another embodiment of the present invention, and this diagram is comparable with that in FIG. 2.

DETAILED DESCRIPTION OF THE INVENTION

Embodiments of the present invention will now be explained in detail by reference to the drawings. The drawings referenced in the following embodiments are drawings simplified or deformed as appropriate, and individual sections therein are not always drawn accurately with regard to ratios between their dimensions, their shapes and so on.

Embodiment 1

Figure 1:
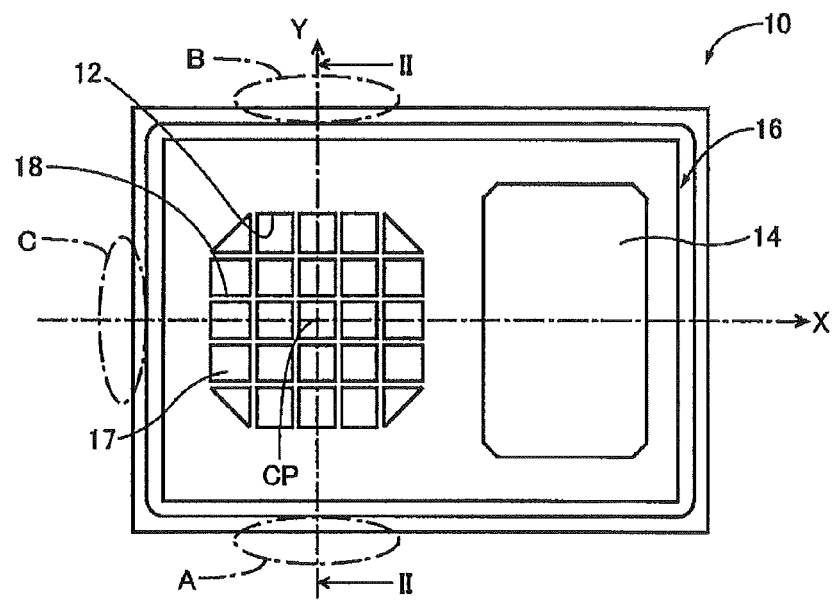
FIG. 1 is a plan view illustrating an example of point source light-emitting diodes to which the present invention has been applied.

FIG. 1 is a plan view illustrating a surface emission-type semiconductor light-emitting element to which the present invention has been applied, that is, a point source light-emitting diode 10. And FIG. 2 is a diagram illustrating a vertical cross section passing through the central point CP of the aperture 12 formed in the topside electrode 16 of the point source light-emitting diode 10, and this diagram is a cross section viewed from the direction along the arrow of the II-II line in FIG. 1. The point source light-emitting diode 10 is a chip-shaped rectangular solid having on its top face not only a topside electrode 16 provided with a locally-formed nearly square aperture 12 and a locally-formed bonding pad 14 but also a light extraction face 17 embraced in the bosom of the aperture 12. The topside electrode 16 is stuck by means of, for example, vapor deposition or sputtering. The topside electrode 16 is formed from, for example, an AuGeNi eutectic alloy. In the interior of the aperture 12 formed in the topside electrode 16, a conductive grid 18 for making current uniform while allowing passage of light in the largest possible amount is provided in a state of being connected to the topside electrode 16. The dot-dash line X in FIG. 1 is parallel to the direction of the length (long side) of the point source light-emitting diode 10 and passes through the central point CP of the aperture 12, while the dot-dash line Y is parallel to the direction of the short side of the point source light-emitting diode 10 and also passes through the central point CP of the aperture 12.

As illustrated in FIG. 2, the point source light-emitting diode 10 has a multilayer structure formed by stacking in this order, a support substrate 20 made from Si and having a thickness of, for example, about several hundred µm; a metal adhesion layer 22 containing a metal (solder) having a low melting point, such as Au—In, Pb—Sn, In—Sn, or Au—Sn; a diffusion-control barrier layer 24 containing, for example, titanium; a metal layer 26 containing, for example, Ag, Al, Au, Pt or an alloy containing any of these metals (e.g. AuZn); a dielectric layer 30 containing, for example, a non-conductive material such as $SiO_2$ and having a plurality of intermediate electrodes 28 containing, for example, AuZn, AuBe or ITO in a state of passing through the dielectric layer; a first contact layer 32 containing, for example, a p-type semiconductor such as p-GaP and having a thickness of 4 µm; a lower clad layer 34 containing, for example, a p-type semiconductor such as $p-Al_{0.53}In_{0.47}P$ and having a thickness on the order of 0.5 µm; an active layer 36 having a multiple quantum well formed from, for example, a multilayer body of $Ga_{0.51}In_{0.49}P$—$(Al_{0.5}Ga_{0.5})_{0.51}In_{0.49}P$; an upper clad layer 38 containing, for example, an n-type semiconductor such as $n-Al_{0.53}In_{0.47}P$ and having a thickness on the order of 0.5 µm; a blocking layer 40 containing, for example, an n-type semiconductor such as $n-(Al_{0.5}Ga_{0.5})_{0.51}In_{0.49}P$ and having a thickness on the order of 2 µm; a second contact layer 42 containing, for example, an n-type semiconductor such as n-GaAs and having a thickness on the order of 50 nm; and a topside electrode 16, in which the diffusion-control barrier layer 24, the metal layer 26 and the dielectric layer 30 are patterned so as to lie locally in the place corresponding to the aperture 12 formed in the topside electrode 16 in a state of being stacked on top of each other.

On the underside of the support substrate 20, an underside electrode 46 having a laminated structure of, for example, Ti and Au is fixed by, for example, vapor deposition or sputtering. In forming the topside electrode 16 and the underside electrode 46, use can be made of metal materials such as precious metals or precious-metal alloys, which are stable during, for example, an etching operation included in the manufacturing procedure of the point source light-emitting diode 10. In the point source light-emitting diode 10, a current-blocking region 44 which blocks the passage of current, is provided by implanting, for example, hydrogen ion ($H^+$) to extend from the underneath of the topside electrode 16 down to the upper clad layer 38 so as to significantly increase resistance. This current-blocking region 44 has the function of narrowing a flow of current passing through the active layer 36 on the way of passage of the current from the topside electrode 16 to the underside electrode 46 fixed on the underside of the support substrate 20 and concentrating the current flow into a region of the active layer 36, specifically a region corresponding to the area directly underneath the aperture 12, thereby making the active layer 36 emit light locally from the region. Accordingly, the point source light-emitting diode 10 has a current-narrowing function of allowing localized emission of light from the active layer 36 through concentration of a current flow into the region directly underneath the light extraction face 17 having a diameter of, for example, about 150 µm.

In the point source light-emitting diode 10, a metal reflection face 50 having a high reflectivity RR1 is formed at the dielectric layer 30 side surface of the metal layer 26, because the dielectric layer 30 inhibits the occurrence of reaction between the metal layer 26 and the first contact layer 32, namely diffusion or alloying, caused by the heat at the time of thermocompression bonding of the support substrate 20, thereby suppressing diffused reflection and light absorption. In this point, the dielectric layer 30 functions as an alloying prevention layer.

On the other hand, reaction between the first contact layer 32 and the metal adhesion layer 22, namely diffusion or alloying occurs at an interface therebetween due to the heat at the time of thermocompression bonding of the support substrate 20 to cause a reduction in reflectivity and/or increase in absorptivity. As a result, the light reflection reduction face 52 having reflectivity RR2 that is lower than the reflectivity RR1 of the metal reflection face 50 is formed at the interface. The alloy layer 54 having the reflectivity RR2 and formed around the metal reflection face 50, though it is a very thin layer, is illustrated by broken lines in FIG. 2 for easiness of understanding. Incidentally, a layer containing a light-reflection reduction material to form the light reflection reduction face 52 may be provided positively so as to encompass the metal reflection face 50 at the boundary surface between the first contact layer 32 and the metal adhesion layer 22. The material and the temperature for forming the light-reflection reduction face 52 have been experimentally determined in advance so that the reflectivity RR2 of the light reflection reduction face 52 satisfies the relation of RR2≤0.8RR1 with respect to the reflectivity RR1 of the metal reflection face 50 provided on the metal layer 26. In addition, adjustment to the reflectivity RR1 of the metal reflection face 50 is preferably adjusted so as to satisfy the relation of RR1≥70% with respect to light of wavelengths to be emitted from the active layer.

In a vertical section passing through the central point CP of the aperture 12 formed locally in the topside electrode 16, as illustrated in FIG. 2, the dielectric layer 30 and the metal reflection face 50 are placed in the same pattern as the aperture 12 and in a concentric state. The metal reflection face 50 is formed so that its diameter L2 has a value in a range satisfying the relation of 0.2L1≤L2≤1.8L1 (preferably 0.6L1≤L2≤1.4L1) with respect to the diameter L1 of the aperture 12; so that when a distance between an edge of the metal reflection face 50 and a point of intersection of the normal to an edge of the aperture 12 and the metal reflection face 50 is taken as distance D, the distance D satisfies the relation of 0≤D≤0.4L1 (preferably 0≤D≤0.2L1) with respect to the dimension L1 of the aperture 12 in FIG. 2; so that when an area of the metal reflection face 50 is taken as area A2 and an area of the aperture 12 is taken as area A1, they satisfy the relation of 0.04A1≤A2≤3.24A1 (preferably 0.36A1≤A2≤1.96A1); and/or so that when a distance between one outer edge and the other outer edge of the topside electrode 16 is taken as distance L3, it is adjusted to satisfy the relation of L2≤0.9L3 in the cross section passing through the center CP of the aperture 12 formed locally in the topside electrode. These relations have been determined experimentally in advance so as to allow compatibility between retention of output light intensity and suppression of side light and achieve further reduction in side light intensity without lowering the output light intensity.

According to the point source light-emitting diode 10 configured as described above, a double heterostructure is formed of the upper clad layer 38, the active layer 36 and the lower clad layer 34, which are stacked on top of each other through crystal growth. When forward current is passed between the topside electrode 16 and the underside electrode 46, the active layer 36 is made to emit light locally in the light emission region P which is situated directly underneath the aperture 12, or equivalently, the light extraction face 17. Light rays generated in the light emission region P of the active layer 36 radiate out in directions of the top face, lateral face and bottom face sides of the point source light-emitting diode 10. Among the light rays emitted from the light emission region P of the active layer 36 to the direction of the side of underside electrode 46, light rays reflected by the metal reflection face 50 to the direction of the top face side are output from the light extraction face 17, together with light rays emitted from the active layer 36 to the direction of the side of the aperture 12. On the other hand, among the light rays emitted from the active layer 36 to the side of underside electrode 46, light rays reaching the light reflection reduction face 52 lying around the metal reflection face 50 undergo absorption or diffused reflection at the light reflection reduction face 52 to result in intensity reduction of the reflected light. The arrows indicated with dot-dash lines in FIG. 2 illustrate those light rays.

Figure 3:
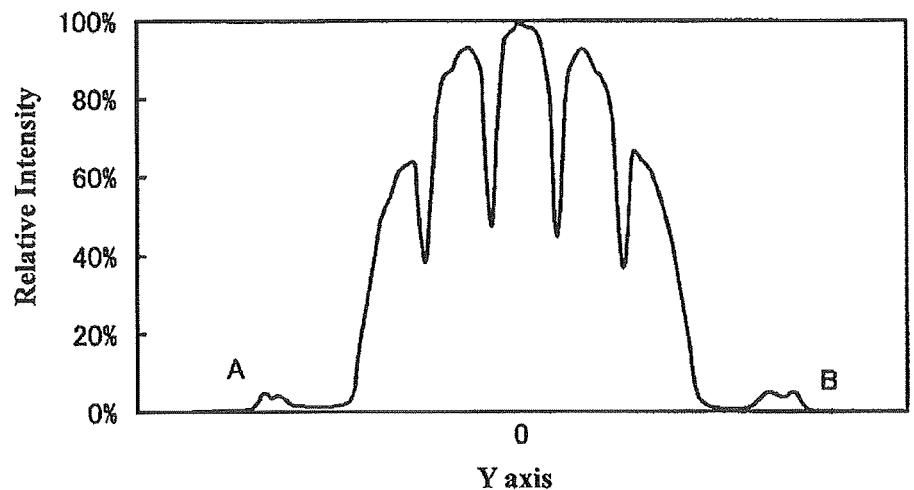
FIG. 3 is a graph showing a light output characteristic that shows the change in the output of light on the light extraction side of the point source light-emitting diode illustrated in FIG. 1 along the Y axis passing through the center of the aperture formed in the topside electrode.

Thus, the point source light-emitting diode 10 not only has a high light extraction efficiency as compared with the case of providing a highly angle-dependent multilayer reflecting mirror (a DBR layer), but also has an adequately suppressed side light leakage from the end faces of the point source light-emitting diode 10 in the regions represented by A, B and C in FIG. 1. FIG. 3 is a graph showing the relative-change characteristic of light intensities measured along the dot-dash line Y in FIG. 1. FIG. 3 indicates that, when the maximum light intensity measured at the position directly above the aperture 12 is taken as 100%, the intensity of side light leaking out from the end faces of the point source light-emitting diode 10 is on the order of 4% to 5% in each of the regions A and B.

Figure 4:
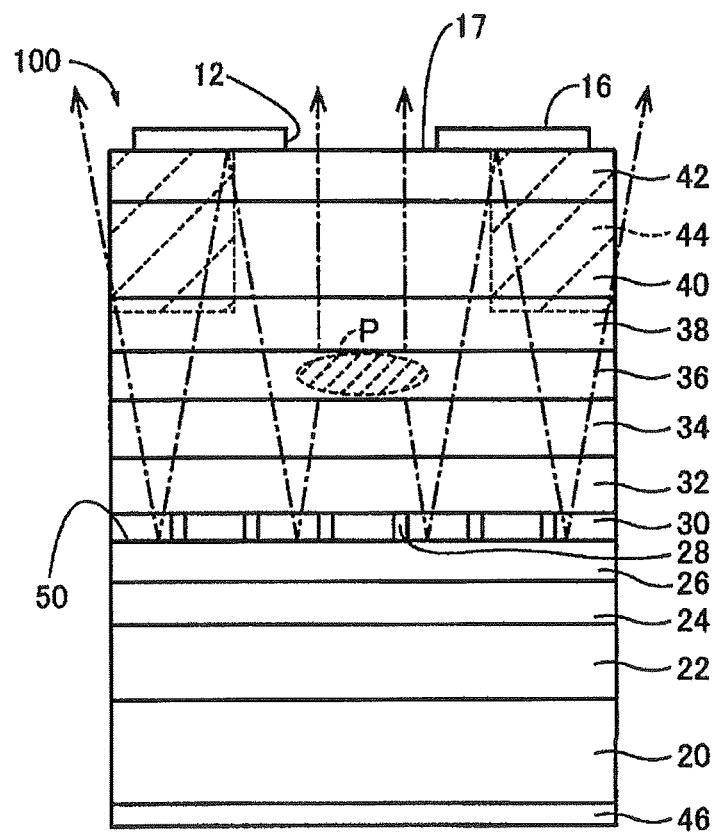
FIG. 4 is a vertical cross-sectional diagram for explaining schematically a multilayer structure of a point source light-emitting diode in which a metal reflection face is provided all over, and this diagram is comparable with that in FIG. 2.

In FIG. 4 is illustrated a structural example of a point source light-emitting diode 100 of a form in which the metal reflection face 50 is provided all over a traverse plane of the diode chip, parallel to the topside electrode 16. The point source light-emitting diode 100 differs from the point source light-emitting diode 10 in a structural way that the diffusion-control barrier layer 24, the metal layer 26 thereon, and the dielectric layer 30 to be sandwiched between the metal layer 26 and the first contact layer 32 are stacked on top of each other so that each layer is spread all over a traverse plane of the diode chip, which is parallel to the topside electrode 16, but the other structural ways are the same.

Figure 5:
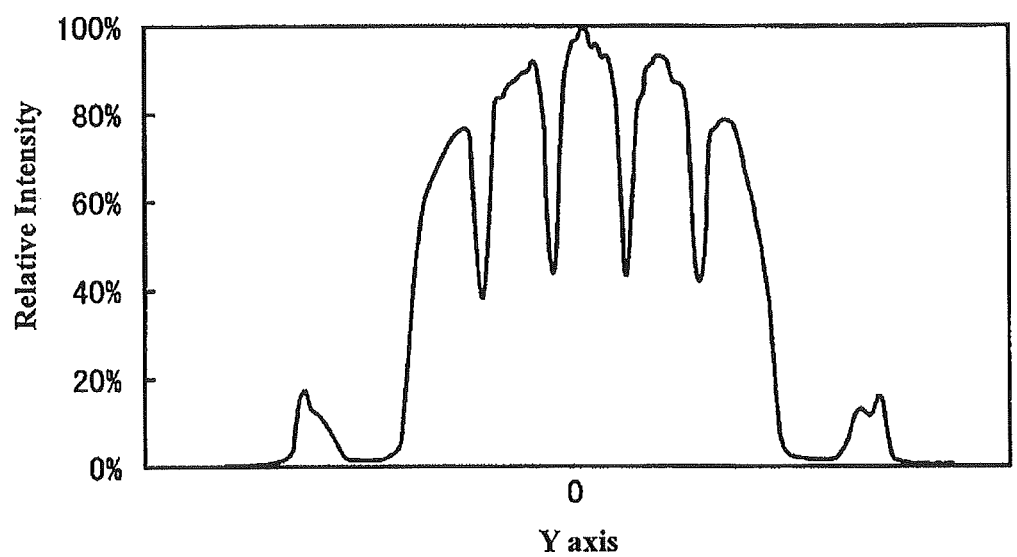
FIG. 5 is a graph showing a light output characteristic of the point source light-emitting diode illustrated in FIG. 4, and this graph is comparable with that in FIG. 3.

According to the point source light-emitting diode 100 configured in the foregoing way, the metal reflection face 50 formed at the interface between the metal layer 26 and the dielectric layer 30 lies all over a traverse plane of the diode chip, which is parallel to the topside electrode 16. Thus, as illustrated by arrows indicated with dot-dash lines in FIG. 4 also, the point source light-emitting diodes 10 and 100 have a common point that, among the light rays emitted from the light emission region P of the active layer 36 to the direction of the side of underside electrode 46, some light rays are reflected by the metal reflection face 50 to the direction of the top face side and output from the light extraction face 17, together with light rays emitted from the active layer 36 to the direction of the side of the aperture 12. In the point source light-emitting diode 100, however, all the light rays emitted from the active layer 36 toward the side of underside electrode 46 and reaching the metal layer 26 are reflected by the metal reflection face 50 and a portion of them leak out from the end faces of the point source light-emitting diode 100, and therefore the intensity of side light becomes relatively high. FIG. 5 is a graph showing the relative-change characteristic of lilt intensities measured along the dot-dash line Y in FIG. 4. FIG. 4 indicates that, when the maximum light intensity measured at the position directly above the aperture 12 is taken as 100%, the intensity of side light leaking out from the end face of the point source light-emitting diode 100 becomes a relatively high value of the order of 20% in each of the regions A and B.

Figure 6:
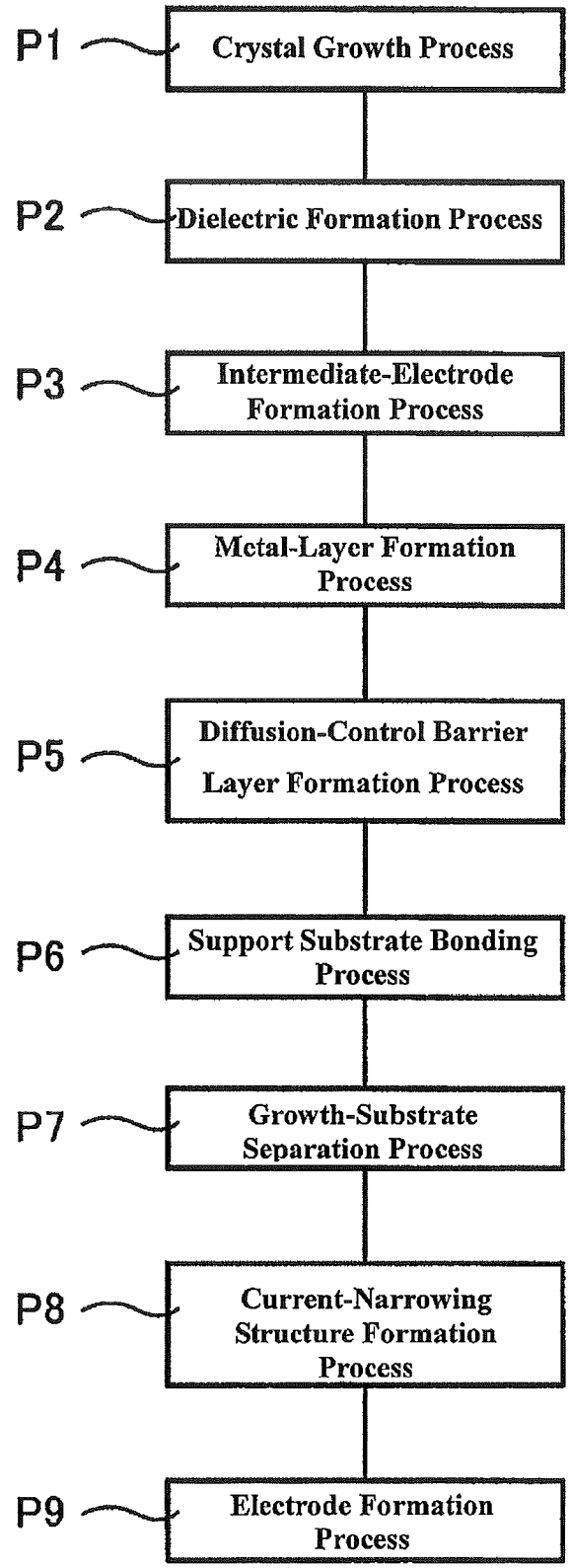
FIG. 6 is a flowchart explaining each of processes in a manufacturing procedure of the point source light-emitting diode illustrated in FIG. 1.
Figure 7:
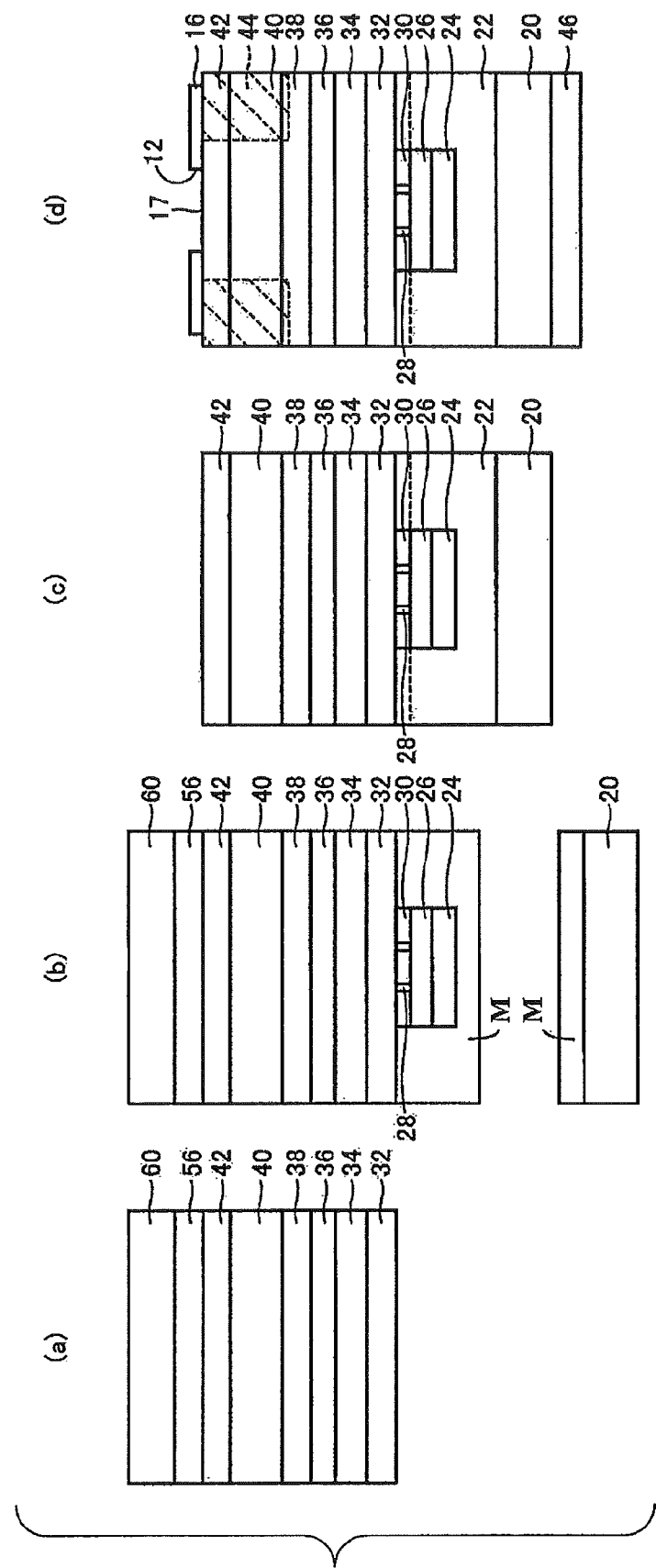
FIG. 7 includes diagrams which illustrate multilayer states attained by the manufacturing processes of FIG. 6, respectively, in which (a) illustrates a multilayer structure of an intermediate product after the crystal growth process P1, (b) illustrates a multilayer structure of another intermediate product after the dielectric formation process P2, the intermediate-electrode formation process P3, the metal-layer formation process P4 and the diffusion-control barrier layer formation process P5, (c) illustrates still another intermediate product after the support substrate bonding process P6 and the growth-substrate separation process P7, and (d)

FIG. 6 is a flowchart explaining main processes in an example of a manufacturing procedure of the point source light-emitting diode 10, and FIG. 7 includes diagrams illustrating the multilayer states of intermediate products obtained in the course of manufacturing processes, respectively. In a crystal growth process P1 of FIG. 6, an etching stop layer 56 containing a compound semiconductor such as $Ga_{0.51}In_{0.49}P$ and having a thickness of the order of 0.2 μm; a second contact layer 42; a blocking layer 40; an upper clad layer 38; an active layer 36; a lower clad layer 34; and a first contact layer 32 are made to grow epitaxially in this order on a growth substrate 60 before being cut and divided, that is, specifically on a semiconductor wafer of GaAs single crystal, through the use of a MOCVD (Metal Organic Chemical Vapor Deposition) method or a MBE (Molecular Beam Epitaxial) method. (a) of FIG. 7 illustrates the state mentioned above.

In the next process, a dielectric layer formation process P2, a dielectric material including, for example, SiO₂ has been stuck on the entire surface of the support substrate 20 side of the first contact layer 32 by the use of an electron-beam deposition, sputtering or plasma CVD method, and the thus stuck dielectric material is subjected to patterning (etching) so as to leave a portion corresponding to the aperture 12 by the use of a photolithographic technique, thereby locally forming a dielectric layer 30. Alternatively, the dielectric material including SiO₂ can be patterned by the use of buffered hydrofluoric acid. In the subsequent intermediate-electrode formation process P3, at least one intermediate electrode 28 is formed by a photolithographic technique. Specifically, the intermediate electrode 28 is formed locally by, for example, providing a resist layer on the dielectric layer 30 only within the area corresponding to an aperture from which light generated in the active layer is to be emitted out, performing vapor deposition or sputtering of an intermediate electrode material such as AuBe or AuZn, and then removing the resist layer. In the subsequent metal-layer formation process P4, a metal layer 26 is formed by a photolithographic technique. More specifically, the metal layer 26 is formed locally by, for example, providing a resist layer on the area other than the area corresponding to the aperture 12, performing resistance heating, electron-beam vapor deposition or sputtering of a metal material such as Ag, Al, Au, Pt or an alloy containing any of them, and then removing the resist layer. In the subsequent diffusion-control barrier layer formation process P5, a diffusion-control barrier layer 24 is formed by the use of a photolithographic technique. More specifically, the diffusion-control barrier layer 24 is formed locally by, for example, providing a resist layer in the area other than the metal layer 26, performing resistance heating, electron-beam vapor deposition or sputtering of a diffusion-control barrier material such as Ti, and then removing the resist layer. Subsequently, a metal adhesion layer 22 is formed.

In the support substrate bonding process P6, as illustrated in (b) of FIG. 7, a metal having a low melting point (indicated as "M" in (b) of FIG. 7), such as Au—In, Pb—Sn, In—Sn or Au—Sn is stuck by vapor deposition or the like not only on the face of the first contact layer 32 on the side which the laminate of the dielectric layer 30, the metal layer 26 and the diffusion-control barrier layer 24 is formed and which lies on the side facing the support substrate 20, but also on the face of the support substrate 20 on the side facing the active layer 36. Then, the face of the active layer 36 side of the wafer-shaped support substrate 20 is brought into a state of being pressed against the face of the support substrate 20 side of the first contact layer 32 and subjected to thermocompression bonding. In the subsequent growth-substrate separation process P7, both the growth substrate 60 and the etching stop layer 56 are removed. For example, the growth substrate containing GaAs is etched with a mixed hydrogen peroxide-ammonia solution. Thereafter, the etching stop layer 56 containing InGaP is etched with a hydrochloric acid-based etching solution. (c) of FIG. 7 illustrates the resulting state.

In the subsequent current-narrowing structure formation process P8, a current-blocking region 44 forming a nonconductive region having a markedly high resistance is formed by, for example, H⁺ ion implantation in a region situated directly underneath the topside electrode 16, not including the light extraction face 17, and extending from the surface of the second contact layer 42 down to an inner plane of the upper clad layer 38 lying at least halfway in its thickness direction. The current-blocking region 44 may be formed in a region extending in the thickness direction from near the first contact layer 32 up to the second contact layer 42. In the electrode formation process P9, a topside electrode 16 is formed by vapor deposition or sputtering on the upper face of the second contact layer 42, namely the topside of the point source light-emitting diode 10. In addition, the back (bottom face) of the point source light-emitting diode 10 is polished to a mirror-finished state, and on the mirror-finished face, an underside electrode 46 is formed by resistance heating, electron-beam vapor deposition or sputtering. Then, the wafer is divided into individual pieces of the point source light-emitting diode 10. (d) of FIG. 7 illustrates the state mentioned above. Thus the point source light-emitting diode 10 illustrated in FIGS. 1 and 2 is formed.

According to the point source light-emitting diode 10 formed in this embodiment, the metal reflection face 50 is provided, as described above, on a localized area of the metal layer 26, namely the area corresponding to the aperture 12 formed locally in the topside electrode 16, which reflects light generated in the active layer 36 to the side of the aperture 12. And around the metal reflection face 50 is provided the light reflection reduction face 52 having a lower reflectivity than that of the metal reflection face 50. With this being the situation, a portion of light rays traveling from a portion of the active layer 36 to the side of the support substrate 20 are reflected by the metal reflection face 50 and another portion of the light rays are absorbed by the light reflection reduction face 52 without undergoing reflection. Thus, side light leaking out from the end face of the chip-shaped point source light-emitting diode 10 is suppressed adequately.

In addition, according to the point source light-emitting diode 10 formed in this embodiment, the p-type semiconductor layer (the first conduction-type layer) includes the first contact layer 32, and the dielectric layer 30 brought into contact with a portion of the first contact layer 32 is provided on the metal layer 26. With this being the situation, reaction between the metal layer 26 and the first contact layer 32, namely diffusion or alloying, is inhibited in a portion in the interface of the metal layer 26 covered with the dielectric layer 30 which is in contact with a portion of the first contact layer 32, and therefore diffused reflection and light absorption are prevented. Thus the metal reflection face 50 having a high reflectivity is formed locally at the active layer side surface of the metal layer 26.

Further, according to the point source light-emitting diode 10 formed in this embodiment, the dielectric layer 30 is provided locally beneath the portion of the first contact layer 32 corresponding to the aperture 12. With this being the situation, in the portion of the upper surface of the metal layer 26 corresponding to the aperture 12, reaction between the metal layer 26 and the first contact layer 32, namely diffusion or alloying, is inhibited, and therefore diffused reflection and light absorption are prevented. Thus the metal reflection face 50 having a high reflectivity is formed locally at the active layer 36 side surface of the metal layer 26.

Furthermore, according to the point source light-emitting diode 10 formed in this embodiment, a plurality of the intermediate electrodes 28 for electric continuity between the first contact layer 32 and the metal layer 26 is provided in a state of passing through the dielectric layer 30. With this being the situation, electric current to travel between the topside electrode 16 and the plurality of the intermediate electrodes 28 comes to flow into the intermediate electrode 28 passing through the dielectric layer 30 provided in the area corresponding to the aperture 12 formed locally in the topside electrode 16, and therefore the electric current suffers no diffusion and is centralized in the region of the active layer 36 corresponding to the area directly underneath the aperture 12 formed in the topside electrode 16. As a result, the active layer 36 is made to emit light locally in the region P corresponding to the area directly underneath the aperture 12 formed in the topside electrode 16. Thus, further suppression of side light emission can be achieved.

In addition, according to the point source light-emitting diode 10 formed in this embodiment, the metal layer 26 is made to lie locally in the same pattern as the dielectric layer 30 in a state of adjoining the dielectric layer 30 underneath the first contact layer 32. With this being the situation, at least the dielectric layer 30 and the metal layer 26 are required to undergo patterning. On the other hand, when the metal layer is made to lie overall beneath the first contact layer, only the dielectric layer is subjected to patterning. In this case of making the metal layer lie overall beneath the contact layer via the localized dielectric layer, alloying occurs at the boundary surface between the first contact layer 32 and the metal layer 26 due to the temperature at the thermocompression bonding, resulting in formation of the light reflection reduction face 52 having a reduced reflectivity and/or an increased absorptivity.

Further, according to the point source light-emitting diode 10 formed in this embodiment, the support substrate 20 is bonded to the first contact layer 32 by thermocompression via the metal adhesion layer 22 containing a metal having a low melting point, and besides, the diffusion-control barrier layer 24 is made to intervene between the metal adhesion layer 22 and the metal layer 26. With this being the situation, reaction between the metal adhesion layer 22 and the metal layer 26 can be prevented from occurring at the temperature at which the metal adhesion layer 22 melts under thermocompression bonding.

Further, according to the point source light-emitting diode 10 formed in this embodiment, in the longitudinal section passing through the center point PC of the aperture 12 formed locally in the topside electrode 16, illustrated in FIG. 2, the diameter L2 of the metal reflection face 50 has a dimension satisfying the relation of $0.2L1 \leq L2 \leq 1.8L1$ (preferably the relation of $0.6L1 \leq L2 \leq 1.4L1$) with respect to the diameter L1 of the aperture 12. With this being the situation, it becomes possible to make retention of output light intensity and suppression of side light compatible with each other, and reduction in intensity of side light can be achieved without lowering the intensity of output light.

In addition, according to the point source light-emitting diode 10 formed in this embodiment, the reflectivity RR2 of the light-reflection reduction face 52 is adjusted to satisfy the relation of $RR2 \leq 0.8RR1$ with respect to the reflectivity RR1 of the metal reflection face 50 provided on the metal layer 26 With this being the situation, it becomes possible to make retention of output light intensity and suppression of side light compatible with each other, and reduction in intensity of side light can be achieved without lowering the intensity of output light.

Further, according to the point source light-emitting diode 10 formed in this embodiment, in the longitudinal section passing through the center point CP of the aperture 12 illustrated in FIG. 2, when the distance between an edge of the metal reflection face 50 and a point of intersection of the normal to an edge of the aperture 12 and the metal reflection face 50 is taken as distance D, the distance D is adjusted to satisfy the relation of $0 \leq D \leq 0.4L1$ (preferably the relation of $0 \leq D \leq 0.2L1$) with respect to the diameter L1 of the aperture 12. With this being the situation, it becomes possible to make retention of output light intensity and suppression of side light compatible with each other, and reduction in intensity of side light can be achieved without lowering the intensity of output light.

Furthermore, according to the point source light-emitting diode 10 formed in this embodiment, when the area of the metal reflection face 50 is taken as A2 and that of the aperture 12 as A1, they satisfy the relation of $0.04A1 \leq A2 \leq 3.24A1$ (preferably the relation of $0.36A1 \leq A2 \leq 1.96A1$). With this being the situation, it becomes possible to make retention of output light intensity and suppression of side light compatible with each other, and reduction in intensity of side light can be achieved without lowering the intensity of output light.

In addition, according to the point source light-emitting diode 10 formed in this embodiment, the distance L3 between one outer edge and the other outer edge of the topside electrode 12 is adjusted to satisfy the relation of $L2 \leq 0.9L3$ in the cross section passing through the center of the aperture formed locally in the topside electrode 16. With this being the situation, suppression of side light can be achieved more effectively.

Embodiment 2

In FIG. 8 is illustrated a structural example of a point source light-emitting diode 70 of a form in which the dielectric layer 30 is provided locally at the place corresponding to the aperture 12 in the same manner as in the point source light-emitting diodes 10, but each of the metal layer 26 and the diffusion-control barrier layer 24 is provided all over a traverse plane of the diode chip, parallel to the topside electrode 16. In the point source light-emitting diode 70, the metal layer 26 and the first contact layer 32 immediately adjoin each other around the dielectric layer 30, and react with each other due to the heat at the time of thermocompression bonding of the support substrate 20, thereby forming a light reflection reduction face 52. Thus, the point source light-emitting diode 70 according to this embodiment can achieve the same operational advantages as the point source light-emitting diode 10.

In the foregoing, representative embodiments according to the present invention are illustrated in detail on the basis of the drawings, and the present invention is also applicable in other aspects.

For example, the active layer 36 of each of the point source light-emitting diodes 10 and 70 formed in the foregoing embodiments has an AlInGaP-base multiple quantum well structure formed from a $Ga_{0.51}In_{0.49}P-(Al_{0.5}Ga_{0.5})_{0.51}In_{0.49}P$ multilayer body, but in the active layer 36 use can be made of, for example, a GaAs-base semiconductor or a GaP-base semiconductor.

Each of the point source light-emitting diodes 10 and 70 may have such a structure containing, for example, a second contact layer 42 containing Si—GaAs or Te—GaAs; an upper clad layer 38 containing Si—$Al_xIn_{1-x}P$ or Te—$Al_xIn_{1-x}P$ (where $0.47 \leq x \leq 0.53$); an active layer 36 containing a barrier layer containing $(Al_xGa_{1-x})_yIn_{1-y}P$ (where $0.47 \leq x \leq 0.53$, $0.47 \leq y \leq 0.53$) and a quantum well layer containing $(Al_xGa_{1-x})_yIn_{1-y}P$ (where $0 \leq x \leq 0.05$, $0.47 \leq y \leq 0.53$); a lower clad layer 34 containing Zn—$Al_xIn_{1-x}P$, Mg—$Al_xIn_{1-x}P$ or C—$Al_xIn_{1-x}P$ (where $0.47 \leq x \leq 0.53$); and a first contact layer 32 containing Mg—GaP or C—GaP.

In addition, each of the point source light-emitting diodes 10 and 70 may contain at least one the layers selected from a dielectric layer 30 containing $SiN_x$, $Al_2O_3$, $TiO_2$ or $Ta_2O_3$; an intermediate electrode layer 28 containing AuZn, AuBe or ITO; a diffusion-control barrier layer 24 containing Pt, Ni, Cr or W; and a support substrate 20 containing SIC, Cu, Mo, $Al_2O_3$ or $SiO_2$.

Further, the active layer 36 of each of the point source light-emitting diodes 10 and 70 formed in the foregoing embodiments has a multiple quantum well structure, but the active layer 36 doesn't necessarily need to have such a structure, and it may have a single-layer quantum well structure or a conventional pn-junction structure.

Additionally, each of the point source light-emitting diodes 10 and 70 formed in the foregoing embodiments has a plurality of intermediate electrodes 28 passing through the dielectric layer 30, but only one intermediate electrode 28 may be provided. It is only essential that at least one intermediate electrode 28 be provided in the dielectric layer 30.

Further, each of the point source light-emitting diodes 10 and 70 formed in the foregoing embodiments has a rectangular shape in its plan view, but it may have another shape such as a square shape. In addition, the aperture 12 in each of the foregoing embodiments has nearly square in shape, but it may be circular in shape or the like.

Furthermore, for the purpose of enhancing light extraction efficiency, the light extraction face 17 of each of the point source light-emitting diodes 10 and 70 formed in the foregoing embodiments may have, on an as needed basis, a many needlelike steep microspikes having sufficiently high heights on the order of 0.4 to 1.0 μm and high aspect ratios formed by undergoing roughening treatment (texturing treatment) utilizing wet or vapor-phase etching. In addition, the light extraction face 17 of each of the point source light-emitting diodes 10 and 70 may be provided with an antireflective film for the purpose of preventing the reflection of light.

In addition, each of the point source light-emitting diodes 10 and 70 formed in the foregoing embodiments has the current-narrowing structure formed by the current-blocking region 44 being provided by ion implantation in a region directly underneath the topside electrode 16, exclusive of a region directly underneath the aperture 12. However, it may have a current-narrowing structure formed by the current-blocking region 44 being provided by diffusion of impurities in a region directly underneath the topside electrode 16, exclusive of the region directly underneath the aperture 12, or a current-narrowing structure formed by removing the current-blocking region 44 through mesa etching.

Incidentally, the foregoing are merely some embodiments of the present invention, and the invention can be performed according to embodiments to which various changes and modifications are made based on knowledge of persons skilled in the art.

The present application is based on Japanese Patent Application No. 2014-044284 filed on Mar. 6, 2014, and the contents thereof are incorporated herein by reference.

DESCRIPTION OF REFERENCE NUMERALS

10, 70, 100: Point source light-emitting diode
12: Aperture
16: Topside electrode
20: Support substrate
22: Metal adhesion layer
24: Diffusion-control barrier layer
26: Metal layer
28: Intermediate electrode
30: Dielectric layer
32: First contact layer
36: Active layer
44: Current-blocking region (Current-narrowing structure)
50: Metal reflection face
52: Light-reflection reduction face

What is claimed is:

1. A point source light-emitting diode comprising:
   a support substrate, a metal layer, a first conduction-type layer, an active layer, a second conduction-type layer containing a current-narrowing structure, and a topside electrode having an aperture, stacking in this order,
   wherein the metal layer has a metal reflection face by which a light generated in the active layer is reflected towards the aperture side,
   wherein the point source light-emitting diode further comprises a light-reflection reduction face having a lower reflectivity and/or a higher absorptivity than the metal reflection face, provided around the metal reflection face,
   wherein the metal reflection face is provided locally in an area corresponding to the aperture,
   wherein a first portion of light rays directed towards the support substrate from a region of the active layer is reflected by the metal reflection face, and
   wherein a second portion of light rays directed towards the support substrate is absorbed by the light-reflection reduction face without being reflected.

2. The point source light-emitting diode according to claim 1, wherein
   the first conduction-type layer comprises a first contact layer, and
   the point source light-emitting diode comprises a dielectric layer being in contact with a portion of the first contact layer and provided on the metal layer.

3. The point source light-emitting diode according to claim 2, wherein
   the dielectric layer is provided locally on an area of the first contact layer, corresponding to the aperture.

4. The point source light-emitting diode according to claim 2, wherein
   the point source light-emitting diode further comprises, in the interior of the dielectric layer, at least one intermediate electrode provided so as to pass through the dielectric layer for electric continuity between the first contact layer and the metal layer.

5. The point source light-emitting diode according to claim 2, wherein
   the metal layer is made to stack locally on the first contact layer in the same pattern as the dielectric layer in a state of adjoining the dielectric layer, or to stack overall on the first contact layer.

6. The point source light-emitting diode according to claim 2, wherein
   the support substrate is bonded to the first contact layer by thermocompression via a metal adhesion layer containing a metal having a low melting point, and
   the point source light-emitting diode further comprises a diffusion-control barrier layer made to intervene between the metal adhesion layer and the metal layer.

7. The point source light-emitting diode according to claim 2, further comprising an alloy layer formed at an interface of the first contact layer and the metal layer,
   wherein the light-reflection reduction face is formed on the alloy layer.

8. The point source light-emitting diode according to claim 2, further comprising a metal adhesion layer containing a metal having a low melting point and provided between the first contact layer and the support substrate, and an alloy layer formed at an interface of the first contact layer and the metal adhesion layer, wherein the light-reflection reduction face is formed on the alloy layer.

9. The point source light-emitting diode according to claim 1, wherein
in a cross section passing through a center of the aperture formed locally in the topside electrode, the metal reflection face has a diameter L2 and the aperture has a diameter L1, satisfying a relation of $0.2L1 \leq L2 \leq 1.8L1$.

10. The point source light-emitting diode according to claim 1, wherein
the light-reflection reduction face has a reflectivity RR2 and the metal reflection face has a reflectivity RR1, satisfying a relation of $RR2 \leq 0.8RR1$.

11. The point source light-emitting diode according to claim 1, wherein
in a cross section passing through a center of the aperture, the metal reflection face has a distance D between an edge of the metal reflection face and a point of intersection of the normal to an edge of the aperture and the metal reflection face, satisfying a relation of $0 \leq D \leq 0.4L1$.

12. The point source light-emitting diode according to claim 1, wherein
the aperture has an area A1 and the metal reflection face has an area A2, satisfying a relation of $0.04 \leq A1 \leq A2 \leq 3.24A1$.

13. The point source light-emitting diode according to claim 1, wherein
the metal reflection face has a diameter L2 and the topside electrode has a distance L3 between one outer edge and another outer edge in a cross section passing through a center of the aperture formed locally in the topside electrode, satisfying the relation of $L2 \leq 0.9L3$.

14. The point source light-emitting diode according to claim 1,
wherein the active layer is stacked such that the first portion of light rays directed towards the support substrate from the region of the active layer is reflected by the metal reflection face and the second portion of light rays directed towards the support substrate is absorbed by the light-reflection reduction face without being reflected to suppress side light leaking out from end faces of the point source light-emitting diode.

15. The point source light-emitting diode according to claim 1, wherein a width of the metal reflection face is less than a width of each of the first conduction-type layer, a surface area of the support substrate layer, and a surface area of the second conduction-type layer.

16. The point source light-emitting diode according to claim 1, wherein the active layer is devoid of the current-narrowing structure.

17. The point source light-emitting diode according to claim 1, wherein the current-narrowing structure is only stacked above the active layer.

18. The point source light-emitting diode according to claim 1, further comprising a light-reflection reduction face surrounding an entirety of the metal reflection face, and
wherein an entire width of both of a dielectric layer and an intermediate electrode forming the metal reflection face is less than a width of the active layer.

19. A point source light-emitting diode comprising:
a support substrate, a metal layer, a first conduction-type layer, an active layer, a second conduction-type layer containing a current-narrowing structure, and a topside electrode having an aperture, stacking in this order,
wherein the metal layer has a metal reflection face by which a light generated in the active layer is reflected towards the aperture side,
wherein the point source light-emitting diode further comprises a light-reflection reduction face having a lower reflectivity and/or a higher absorptivity than the metal reflection face, provided around the metal reflection face,
wherein the metal reflection face is provided locally in an area corresponding to the aperture, and
wherein the active layer is stacked such that a first portion of light rays directed towards the support substrate from a region of the active layer is reflected by the metal reflection face and a second portion of light rays directed towards the support substrate is absorbed by the light-reflection reduction face without being reflected.

20. A point source light-emitting diode comprising:
a support substrate, a metal layer, a first conduction-type layer, an active layer, a second conduction-type layer containing a current-narrowing structure, and a topside electrode having an aperture, stacking in this order,
wherein the metal layer has a metal reflection face by which a light generated in the active layer is reflected towards the aperture side,
wherein the point source light-emitting diode further comprises a light-reflection reduction face having a lower reflectivity and/or a higher absorptivity than the metal reflection face, provided around the metal reflection face,
wherein the metal reflection face is provided locally in an area corresponding to the aperture, and
wherein the light-reflection reduction face provided around the metal reflection face is formed on a layer containing a light-reflection reduction material.

* * * * *